(12) United States Patent
Itoh

(10) Patent No.: US 7,053,751 B2
(45) Date of Patent: May 30, 2006

(54) RESISTANCE HYBRID, AND VOLTAGE DETECTION AND CONSTANT VOLTAGE GENERATING CIRCUITS INCORPORATING SUCH RESISTANCE HYBRID

(75) Inventor: Kohzoh Itoh, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 526 days.

(21) Appl. No.: 10/143,901

(22) Filed: May 14, 2002

(65) Prior Publication Data

US 2002/0180453 A1 Dec. 5, 2002

(30) Foreign Application Priority Data

May 14, 2001 (JP) ........................................ 2001-142873

(51) Int. Cl.
*H01C 7/00* (2006.01)

(52) U.S. Cl. ................................................ 338/333
(58) Field of Classification Search ............... 338/195, 338/295, 320, 323, 324, 333; 324/225, 549, 324/550

See application file for complete search history.

(56) References Cited

U.S. PATENT DOCUMENTS

| | | | | | |
|---|---|---|---|---|---|
| 4,924,225 | A | * | 5/1990 | Dingwall et al. | 341/118 |
| 5,339,067 | A | * | 8/1994 | Harris et al. | 338/323 |
| 5,483,162 | A | * | 1/1996 | Ushikoshi et al. | 324/252 |
| 5,550,469 | A | * | 8/1996 | Tanabe et al. | 324/251 |
| 5,818,225 | A | * | 10/1998 | Miekley et al. | 324/251 |
| 6,111,494 | A | * | 8/2000 | Fischer et al. | 338/320 |
| 2004/0096591 | A1 | * | 5/2004 | Kimino | 427/421 |

FOREIGN PATENT DOCUMENTS

| | | | |
|---|---|---|---|
| EP | 0441294 A2 | * | 4/1991 |
| JP | 2000-015799 | | 1/2000 |

* cited by examiner

*Primary Examiner*—Adolf Berhane
(74) *Attorney, Agent, or Firm*—Dickstein Shapiro Morin & Oshinsky LLP

(57) ABSTRACT

A resistance hybrid is disclosed including m+1 unit resistors connected in series, to further be connected in series between two resistance elements, one Rbottom and the other Rtop. Each unit resistor SBn includes an error correction resistance element R1dn and a set resistance element RTn connected in series, and further connected in parallel to a fuse RLn. In addition, the error correction resistance element R1dn is formed such that the combined resistance of the fuse RLn, set resistance element RTn, and error correction resistance element R1dn, is equal to the resistance value of the error correction resistance element R1dn. The value of resistance of the unit resistor SBn after the disconnection increases by the resistance value of set resistance element RTn, to thereby obviating the error possibly caused by the disconnection, which is originated from the resistance value of the fuse RLn. The resistance error caused by the disconnection can be reduced in the present resistance hybrid without appreciable increase in the resistance area, which is particularly advantageous in use for analogue circuits in various semiconductor integrated circuits such as voltage detection and constant voltage generating circuits.

33 Claims, 5 Drawing Sheets

US 7,053,751 B2

RESISTANCE HYBRID, AND VOLTAGE DETECTION AND CONSTANT VOLTAGE GENERATING CIRCUITS INCORPORATING SUCH RESISTANCE HYBRID

Such a resistance hybrid has been disclosed in Japanese Laid-Open Patent Application No. 2000-150799 and illustrated in FIG. 7.

This document claims priority and contains subject matter related to Japanese Patent Application No. 2001-142873, filed with the Japanese Patent Office on May 14, 2001, the entire contents of which are hereby incorporated by reference.

FIELD OF INVENTION

This patent specification relates to a resistance hybrid capable of being suitably adjusted the resistance thereof by disconnecting its component resistance element and to voltage detection and constant voltage generating circuits incorporating such resistance hybrid, which are in use for analogue circuits in various semiconductor integrated circuits.

BACKGROUND OF THE INVENTION

With the increase of usefulness of resistance hybrids and various circuits incorporating resistance hybrids in the field of integrated analogue circuitry, precise resistance adjustment in the resistance hybrid without undue increase in hybrid circuit area is of great importance.

As illustrated in FIG. 5, for example, a constant voltage generating circuit 9 is provided to supply a stable power from DC power source 5 to load 7. The circuit 9 includes an input terminal (Vbat) 11, to which the DC power source 5 is connected, a reference voltage (Vref) generator 13, an operational amplifier 15, a P-channel MOS transistor 17 (which is hereinafter referred to as PMOS) to serve as an output driver, a voltage divider consisting of resistors, R1 and R2, and an output terminal (Vout) 19.

The operational amplifier 15 is incorporated into the constant voltage generating circuit 9 such that the output terminal of the amplifier 15 is connected to the gate of PMOS 17, the noninverting terminal thereof is input with the reference voltage, Vref, from the reference voltage generator 13, and the inverting terminal thereof is input with the output voltage (Vout) divided by the resistors, R1 and R2.

The constant voltage generating circuit 9 is therefore controlled to bring the voltage divided by the resistors, R1 and R2, to be equal to the reference voltage, Vref.

FIG. 6 is an electrical schematic diagram illustrating a voltage detection circuit.

Referring to FIG. 6, an operational amplifier 15 is incorporated into the voltage detection circuit 21 so as for the inverting terminal of the amplifier 15 to be input with a reference voltage, Vref, from reference voltage generator 13. The voltage, Vsens, which is input to an input terminal 23 to be measured presently, is divided by the resistors, R1 and R2. The thus divided voltage is then input to the noninverting terminal of the amplifier 15. In addition, the output of the amplifier 15 is then sent to exterior by way of an output terminal 25.

The voltage detection circuit 21 is therefore operated such that the output level of the amplifier 15 remains H, if the above noted voltage, Vsens, is high enough to bring the voltage divided by the resistors, R1 and R2, be higher than the reference voltage, Vref, while the output level turns to L, if the voltage, Vsens, decreases so as to bring the voltage divided by the resistors lower than the reference voltage.

In the constant voltage generating circuit of FIG. 5 and the voltage detection circuit of FIG. 6, there encountered in general is scattering of the reference voltage Vref, which is output by the reference voltage generator, that is considered primarily due to scattering of working parameters during manufacturing process steps.

This scattering is alleviated in practice by compensating by using a suitable device such as, for example, a resistance hybrid, the resistance value of which can be adjusted by disconnecting its component fuse element and thereby be able to suitably serve as a voltage divider having desirable resistance value.

Such a resistance hybrid has been disclosed in Japanese Laid-Open Patent Application No. 2000-15799 and illustrated in FIG. 7.

Referring to FIG. 7, the resistance hybrid includes an Rbottom resistance element, M+1 set resistance elements, SB0, SB1, . . . , SBm, with m being a positive integer, and an Rtop resistance element, which are connected in series. The set resistance elements, SB0, SB1, . . . , SBm, are respectively accompanied by corresponding fuse elements (or fuses), RL0, RL1, . . . , RLm, connected in parallel, thereby forming respective unit resistances.

In the above construction of the resistance hybrid, the accuracy of the resistance ratio of the set resistance element to the fuse is of considerable importance to determine accurately resultant resistance values of the resistance hybrid. These unit resistances connected in series are fabricated in practice being arranged in a ladder-type manner (FIG. 7).

The desirable value of the resistance can be obtained using the above structure after disconnecting arbitrary fuses which are properly selected among RL0, RL1, . . . , RLm, by irradiating laser beams.

For the adjustment of the hybrid resistance value, the error in resultant resistance following fuse disconnection can be reduced by forming beforehand the fuses, RL0, RL1, . . . , RLm, and the set resistance elements, RT0, RT1, . . . , RTm, so as for the fuses to have resistance values negligibly small compared with those of the set resistance elements (or for the set resistance elements to have resistance values large enough for those of the fuses to be taken negligibly small in comparison).

The resistance hybrid of FIG. 7 may be utilized as the voltage divider consisting of resistors, R1 and R2, included in the constant voltage generating circuit of FIG. 5, in which the end terminal of the resistance hybrid on the Rbottom side is grounded, the end terminal thereof on the Rtop side is connected to the drain of PMOS 17, the end terminal thereof on the Rtop side is connected to the drain of PMOS 17, and the junction terminal, Node L, which is formed between Rbottom and RT0, is connected to the noninverting terminal of operational amplifier 15.

The resistance hybrid of FIG. 7 may also be utilized as the voltage detection circuit illustrated in FIG. 6, in which the end terminal of the resistance hybrid on the Rbottom side is grounded (or earthed), the end terminal thereof on the Rtop side is connected to a terminal 23, and the junction terminal, Node L, is connected to the noninverting terminal of operational amplifier.

Therefore, the voltage dividing resistor R1 consists of Rtop, set resistance elements, RT0, RT1, . . . , RTm, and fuses, RL0, RL1, . . . , RLm, while the dividing resistor R2 consists of Rbottom.

In addition, the resistance hybrid of FIG. 7 may be utilized as the voltage divider consisting of resistors, R1 and R2, included in the constant voltage generating circuit of FIG. 5, in which the end terminal of the resistance hybrid on the Rbottom side is grounded, the end terminal thereof on the Rtop side is connected to the drain of PMOS 17, the end terminal thereof on the Rtop side is connected to the drain of PMOS 17, and the junction terminal, Node M, which is formed between Rbottom and RTm, is connected to the noninverting terminal of operational amplifier 15.

The resistance hybrid of FIG. 7 may also be utilized as the voltage detection circuit illustrated in FIG. 6, in which the end terminal of the resistance hybrid on the Rbottom side is grounded, the end terminal thereof on the Rtop side is connected to a terminal 23, and the junction terminal, Node M, is connected to the noninverting terminal of operational amplifier.

Therefore, the voltage dividing resistor, R1, consists of Rtop, while the dividing resistor, R2, consists of set resistance elements RT0, RT1, . . . , RTm, fuses, RL0, RL1, . . . , RLm, and Rbottom.

When the resistance value following fuse disconnection of the resistance hybrid of FIG. 7 is either relative small or close to that of the fuses, RL0, RL1, . . . , RLm, the effect on the hybrid resistance from the resistance of the fuses, RL0, RL1, . . . , RLm, cannot be neglected, and there arises a certain amount of error. This error may be alleviated by forming set resistance elements RT0, RT1, . . . , RTm, with some error components included therein beforehand.

In the resistance hybrid, in which higher accuracy in the resistance value is required for resistor pair (or unit resistor) consisting of the set resistance element and fuse, a resultant resistor component is fabricated in practice by connecting a plurality of the unit resistors either in series or in parallel.

As a result, the resistance value of the set resistance element is restricted to the resistance value, and the number of the unit resistor. Therefore, there has been encountered a drawback previously, in which the set resistance elements cannot necessarily be formed beforehand including therein the above mentioned error components.

In addition, if there is a certain error in the resistance hybrid of FIG. 7, this may give rise to another drawback for several circuits such as, for example, constant voltage generating circuit and voltage detection circuit, which utilize the resistance hybrid as a voltage divider. Namely, with such a resistance hybrid, neither desirable output voltages can be obtained for the constant voltage generating circuit, nor the voltage detection with respect to a precise level of voltage can be achieved.

As another method for reducing resistor error in such resistance hybrids, there may be cited a circuit having small resistance values of fuse elements as illustrated in FIG. 8.

Referring to FIG. 8, a plurality of fuses, RL0, RL1, . . . , RLm, are connected in parallel to each of the set resistance elements RT0, RT1, . . . , RTm, to thereby be able to reduce the resistance values for the fuses compared with those of the corresponding set resistance element. In this case, the fuse disconnection is carried out simultaneously for the entire set of the fuses which are connected to the same set resistance element.

In this method, however, a number of fuses have to be formed and connected in parallel. This gives rise to further drawbacks such as, for example, the increase in, the number of fuses to be connected, and the interval therebetween, and the concomitant increase in the fuse area which is required for securely carrying out the fuse disconnection. As a result, the area for forming such hybrid has to be larger than without parallel fuses.

SUMMARY OF THE INVENTION

Accordingly, it is an object of the present disclosure to provide a resistance hybrid, and voltage detection and constant voltage generating circuits incorporating such resistance hybrid as the voltage divider, having most, if not all, of the advantages and features of similar employed circuits, while eliminating many of the aforementioned disadvantages.

It is another object to provide a resistance hybrid capable of being suitably adjusted the resistance thereof by disconnecting its component resistance element without undue increase in hybrid circuit area, and also to provide voltage detection and constant voltage generating circuits incorporating such resistance hybrid.

The following brief description is a synopsis of only selected features and attributes of the present disclosure. A more complete description thereof is found below in the section entitled "Description of the Preferred Embodiments".

A resistance hybrid disclosed herein includes a plurality of unit resistors connected either in series or in parallel. The unit resistors each consist of a set resistance element, an error correction resistance element, and an exclusive resistance element for disconnection; the set resistance element and the error correction resistance element are connected in series to form a series resistance element, and the series resistance element and the exclusive resistance element for disconnection are connected in parallel, in which the resistance of the error correction resistance element is equal to the combined resistance of the set resistance element, the error correction resistance element, and the exclusive resistance element for disconnection, prior to disconnecting the exclusive resistance element.

Following the disconnection of the exclusive resistance element, the resistance value of the unit resistor becomes equal to the combined resistance of set resistance element and error correction resistance element. Since the resistance of the error correction resistance element is formed beforehand to be equal to the combined resistance of the set resistance element, the error correction resistance element, and the exclusive resistance element, as mentioned just above, the resistance value following the disconnection increases by the resistance of the set resistance element.

As result, the resistance error possibly caused by the exclusive resistance element can be alleviated. In addition, since the element to be added are only some of the error correction resistance elements in the present hybrid structure, the increase in resistance area can remain to be relatively small.

Furthermore, the resistance hybrid disclosed herein is characterized by the error correction resistance element and exclusive resistance element for disconnection, included in each of the plurality of unit resistors, are formed of polysilicon patterns which are each formed of the same material equal in width and alignment direction.

The resistance hybrid disclosed herein may suitably be incorporated into a voltage detection circuit.

The voltage detection circuit includes dividing resistors for dividing an input voltage so as to supply a divided voltage, a reference voltage generator for supplying a reference voltage, and a comparator circuit for comparing the divided voltage with the reference voltage, in which the dividing resistors include the resistance hybrid to serve as a voltage divider, including a plurality of unit resistors connected either in series or in parallel.

The unit resistors herein each consists of a set resistance element, an error correction resistance element, and an exclusive resistance element for disconnection; the set resistance element and error correction resistance element are connected in series to form a series resistance element, and the series resistance element and the exclusive resistance element for disconnection are connected in parallel.

In addition, the resistance of the error correction resistance element is formed to be equal to the combined resistance of the set resistance element, error correction resistance element, and exclusive resistance element for disconnection, prior to disconnecting the exclusive resistance element.

Since the dividing resistors incorporated into the circuit are formed of the resistance hybrid disclosed herein, the resistance error, which is possibly caused by disconnection of the exclusive resistance element, can be alleviated. As a result, the voltage error detected by the voltage detection circuit can be reduced.

The resistance hybrid disclosed herein may suitably be incorporated also into a constant voltage generation circuit.

The constant voltage generation circuit includes an output driver for controlling the outputting an input voltage, dividing resistors for dividing the output so as to supply a divided voltage, a reference voltage generator for supplying a reference voltage, and a comparator circuit for comparing the divided voltage with the reference voltage so as to control the operation of the output driver based on comparison results, in which the dividing resistors include the resistance hybrid similar to that mentioned above in use for the voltage detection circuit.

Since the dividing resistors incorporated into the circuit are formed of the resistance hybrid disclosed herein, the resistance error, which is possibly caused by the disconnection of exclusive resistance element, can be alleviated. As a result, the error in output voltage from the constant voltage generation circuit can be reduced.

BRIEF DESCRIPTION OF THE DRAWINGS

The present disclosure and features and advantages thereof will be more readily apparent from the following detailed description and appended claims when taken with drawings in which:

DESCRIPTION OF THE PREFERRED EMBODIMENTS

In the detailed description which follows, specific embodiments of resistance hybrids are described with respect to voltage detection and constant voltage generating circuits. It is understood, however, that the present disclosure is not limited to these embodiments. For example, the use of the resistance hybrid disclosed herein may also be adaptable to any form of electronic circuits and systems. Other embodiments will be apparent to those skilled in the art upon reading the following description.

A resistance hybrid disclosed herein preferably includes a plurality of unit resistors connected either in series or in parallel, in which the unit resistors each consist of a set resistance element, an error correction resistance element, and an exclusive resistance element for disconnection (or a resistance element in use exclusively for disconnection to implement error correction). With this construction, the resistance hybrid is capable of being properly adjustable its resistance value by disconnecting the exclusive resistance element for disconnection. As a result, the versatility of the resistance hybrid can increase considerably.

As being included in each of the plurality of unit resistors, the error correction resistance element is formed of polysilicon patterns, which are each formed of a same material, having an equal width and an equal alignment direction. In addition, the exclusive resistance element for disconnection, which is included in each of the plurality of unit resistors, is formed of polysilicon patterns, and each of the patterns is formed of a same material, having an equal size and an equal alignment direction.

With the present materials selection and fabrication method for forming the error correction resistance elements and the exclusive resistance element, dispersion of the resistance value possibly caused during process steps for these resistance elements can be reduced.

The following examples are provided further to illustrate preferred embodiments. This is intended to be illustrative but not to be limiting to the materials, circuits or methods described herein.

Figure 1:
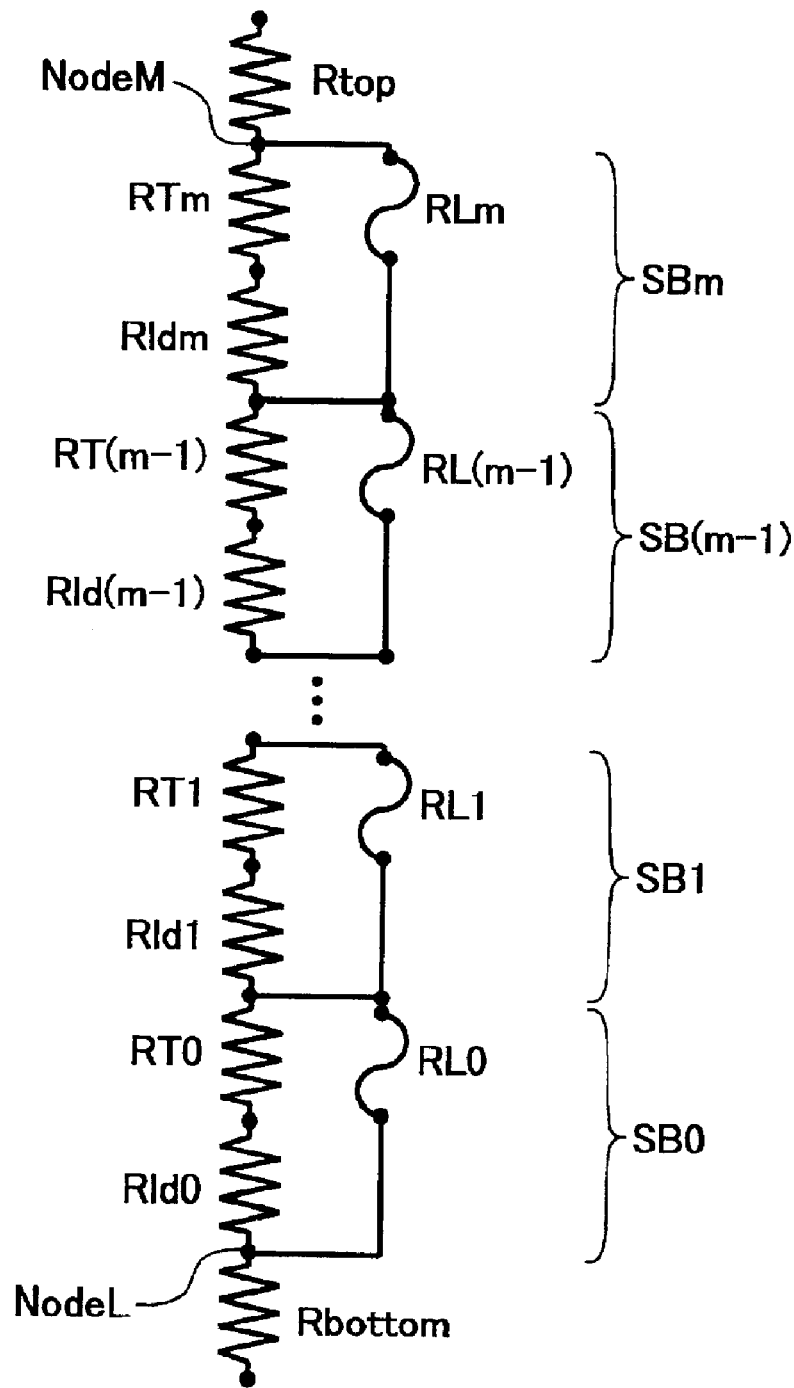
FIG. 1 is an electrical schematic diagram illustrating a resistance hybrid according to one embodiment disclosed herein.
Figure 2:
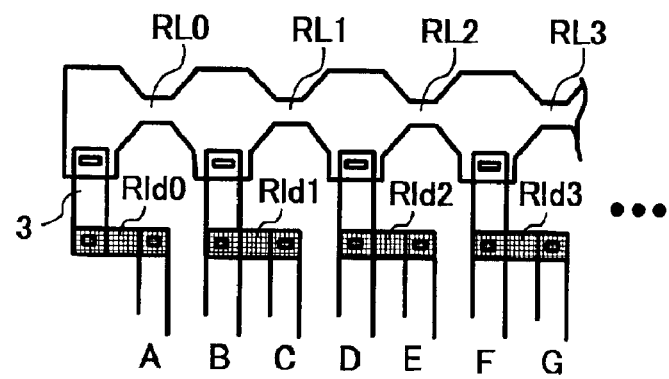
FIG. 2 is a schematic diagram illustrating a layout pattern with error correction resistance elements and exclusive resistance elements for disconnection included in the resistance hybrid of FIG. 1.
Figure 3:
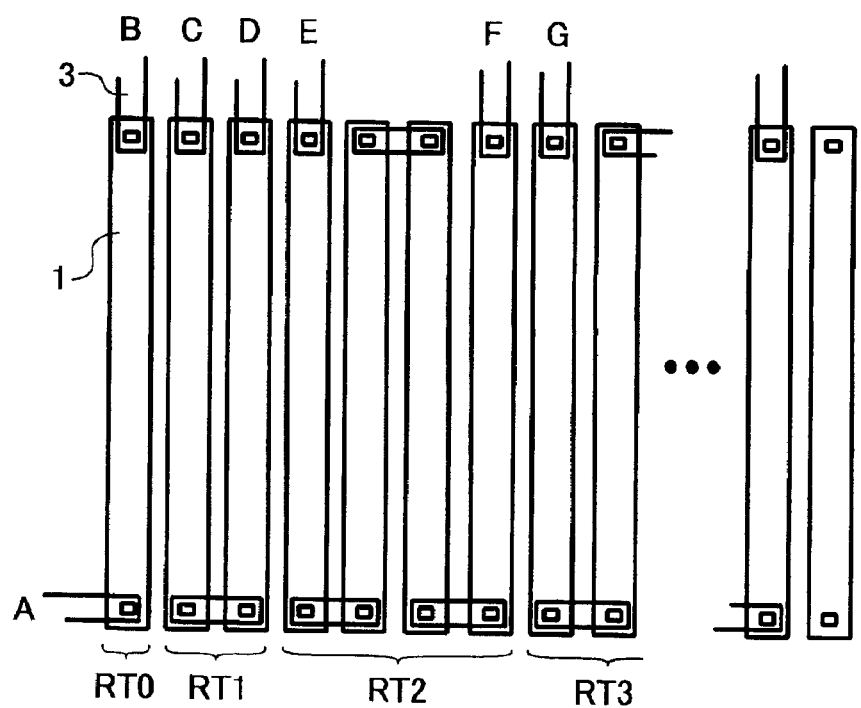
FIG. 3 is a schematic diagram illustrating a layout pattern of set resistance elements included in the resistance hybrid of FIG. 1.

FIGS. 1 through 3 are prepared to illustrate a resistance hybrid, according to one embodiment disclosed herein, in which FIG. 1 is an electrical schematic diagram illustrating the resistance hybrid, FIG. 2 is a schematic diagram illustrating a layout pattern with error correction resistance elements and exclusive resistance elements for disconnection, included in the resistance hybrid, and FIG. 3 is a schematic diagram illustrating a layout pattern of set resistance elements included in the resistance hybrid.

Referring first to FIG. 1, an error correction resistance element and a set resistance element are connected in series, and this series circuit is then connected in parallel to an exclusive resistance element for disconnection (which is hereinafter also referred to as 'fuse'), to thereby constitute a unit resistor SB0.

In a similar manner, a plurality of the unit resistors are formed so as to amount to M+1 units, SB0, SB1, . . . , SBm, with m being a positive integer. The M+1 unit resistors are subsequently connected in series, and this series of unit resistors is further connected in series between two resistance elements, one Rbottom and the other Rtop.

From the side of the resistance element Rbottom, there designated herein are error correction resistance elements, R1d0, R1d1, . . . , R1dm; set resistance elements, RT0, RT1, . . . , RTm; and fuses, RL0, RL1, . . . , RLm; respectively.

The unit resistor, SBn (0≦n≦m), which is the (n+1)th starting from SB0, therefore, consists of the (n+1)th error correction resistance element R1dn, the (n+1)th set resistance element RTn, and the (n+1)th fuse RLn.

In addition, set resistance elements are formed such that the values of resistance for these respective elements, RT0, RT1, . . . , RTm, increase in a manner of geometric progression with the common ratio of two starting again from the side of Rbottom. Therefore, the value of resistance for the set resistance element RTn is $2^n$ times the resistance value of RT0.

A plurality of polysilicon patterns 1 are formed, for example, each equal in size and aligned as shown in FIG. 3. By subsequently connecting a predetermined manner to satisfy the abovementioned resistance value requirement, the set resistance elements RT0, RT1, . . . , RTm, can be formed. Namely, the set resistance element RT0 is formed with one of the polysilicon pattern 1 as the unit resistance value, and the element RTn is formed with $2^n$ of the polysilicon patterns.

The polysilicon patterns 1 is each formed of, for example, a high resistance polysilicon layer which has a sheet resistivity ranging from 100□ to 10 k□ after implanted with either p- or n-type impurities.

The error correction resistance element R1dn is formed such that the value of resistance thereof is equal to that of unit resistor SBn, prior to the disconnection of the fuse RLn. That is, the combined resistance of the fuse RLn, set resistance element RTn, and error correction resistance element R1dn, is equal to the resistance value of the error correction resistance element R1dn.

Accordingly, the resistance value of the error correction resistance element R1dn is given by the relation $$R_{1dn} = \{-R_{Tn}^2 + (R_{Tn} + 4R_{Ln}R_{Tn})^{1/2}\}/2 \quad (1),$$

where the values of resistance are $R_{1dn}$, $R_{Tn}$, and $R_{Ln}$, for the error correction resistance element R1dn, set resistance element RTn, and fuse RLn, respectively.

When the fuse RLn is disconnected, the value of resistance of the unit resistor SBn becomes the combined resistance of the set resistance element RTn and error correction resistance element R1dn.

Since the resistance value of the error correction resistance element R1dn is brought to be equal to the combined resistance of the set resistance element RTn, error correction resistance element R1dn, and the fuse RLn, as mentioned above, the value of resistance of the unit resistor SBn after the disconnection increases by the resistance value of set resistance element RTn.

As a result, additional error caused by the disconnection, which is originated from the resistance value of the fuse RLn, can be obviated.

In addition, it may be noted herein that the present method of layout is advantageous over previous methods, since the present layout can be achieved by additionally providing the error correction resistance element R1dn with a slight increase in the resistance area.

The fuses, RL0, RL1, . . . , RLm, are formed of, for example, a polysilicon layer, each equal in size and arranged as shown in FIG. 2, which has a sheet resistivity ranging from 20□ to 40□. In addition, the error correction resistance elements, R1d0, R1d1, . . . , R1dm, are also formed of a polysilicon layer, each equal in size and arranged as also shown in FIG. 2, which has a sheet resistivity ranging from 20□ to 40□. With the present materials selection and fabrication method, dispersion of the resistance value for the elements during process steps can be reduced.

Furthermore, by utilizing polysilicon layers deposited by the same process steps for forming both of the fuses RL0, RL1, . . . , RLm, and error correction resistance elements, R1d0, R1d1, . . . , R1dm, the formation of the latter elements can be achieved even without increasing the number of process steps compared with previous methods.

The intervals between symbols, A—A, B—B, . . . , G—G, shown in FIGS. 2 and 3, are respectively electrically connected by metal wirings 3. These metal wirings 3 are each formed of, for example, metal alloy containing 98.5% of aluminum, 1% of silicon, and 0.5% of cupper, having a sheet resistivity ranging from 0.04□ to 0.1□.

Figure 5:
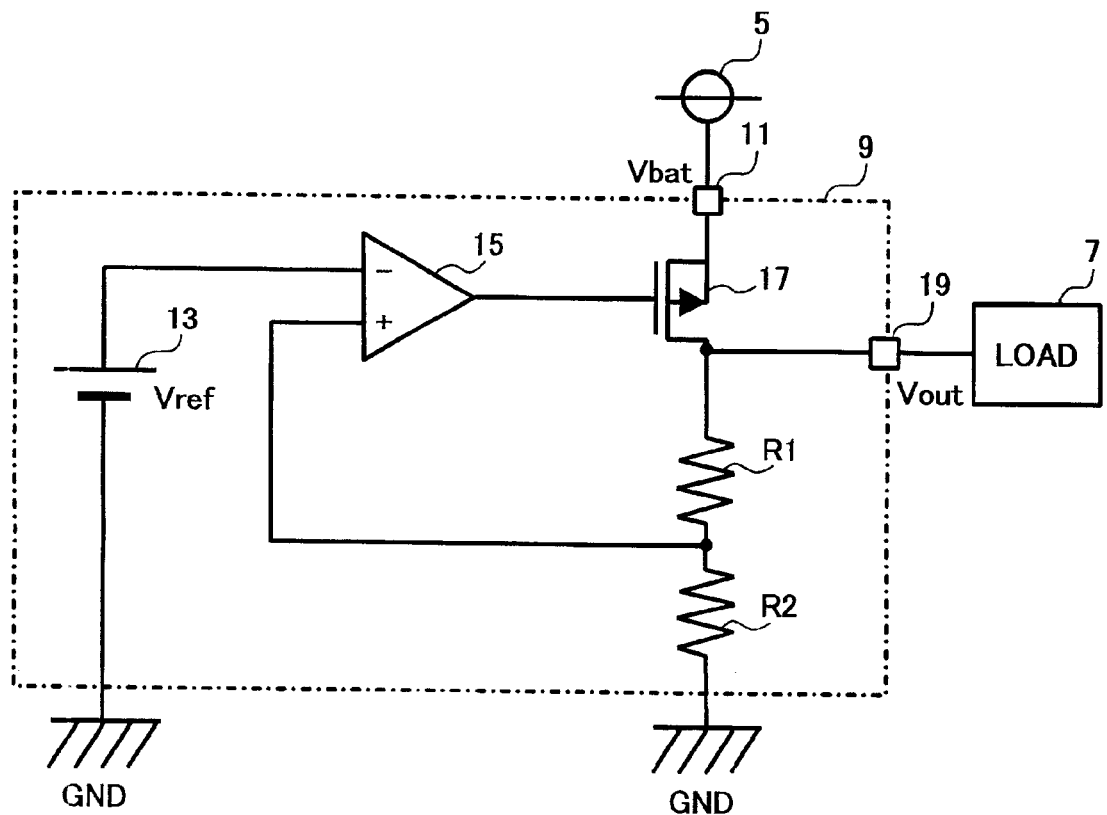
FIG. 5 is an electrical schematic diagram illustrating a constant voltage generating circuit.

According to another embodiment disclosed herein, the resistance hybrid of FIG. 1 is suitably incorporated into a constant voltage generating circuit illustrated in FIG. 5, in which the resistance hybrid serves as a voltage divider consisting of dividing resistors, R1 and R2.

Referring to FIGS. 1 and 5, the constant voltage generating circuit 9 is formed at least by grounding the end terminal of the resistance hybrid on the Rbottom side, connecting the end terminal thereof on the Rtop side to the drain of PMOS 17, and by connecting the junction terminal, Node L, which is formed between Rbottom and R1d0, to the noninverting terminal of operational amplifier 15.

Therefore, the voltage dividing resistor, R1, consists of Rtop, error correction resistance elements, R1d0, R1d1, . . . , R1dm, set resistance elements RT0, RT1, . . . , RTm, and fuses, RL0, RL1, . . . , RLm, while the dividing resistor, R2, consists of Rbottom.

The divided voltage, which is to be fed back from the terminal Node L to noninverting terminal of operational amplifier 15, is appropriately adjusted as follows. First, a trimming code, T, is obtained from the relation $$T = (R_{top} + R_{bottom} + R_{1d0} + R_{1d1} + \ldots + R_{1dm})$$
$$\times (V_{set}/V_{mes} - 1)/R_{t0} \quad (2),$$

where $R_{top}$ is the resistance value of the element Rtop, $R_{bottom}$ resistance value of the element Rbottom, $R_{1d0} + R_{1d1} + \ldots + R_{1dm}$ the sum of the resistance values of error correction resistance elements, R1d0, R1d1, . . . , R1dm, $R_{t0}$ the resistance value of the set resistance element RT0, $V_{set}$ a set value for output voltage of constant voltage generating circuit 9, and $V_{mes}$ an output voltage measured prior to the fuse disconnection.

Second, the trimming code, T, obtained from the relation (2) is subsequently converted to a binary number, and the unit resistors those are identified among the series of unit resistors, SB0, SB1, . . . , SBm, that correspond to the figures presently having "1" in the binary number. Subsequently, by disconnecting the thus identified fuses, the selected value of the output voltage can be obtained for the voltage generating circuit.

Alternatively, the constant voltage generating circuit 21 of FIG. 5 may be formed at least by grounding the end terminal of the resistance hybrid on the Rbottom side, connecting the end terminal thereof on the Rtop side to the drain of PMOS 17, and connecting the junction terminal, Node M, which is formed between Rtop and RTm, to the noninverting terminal of operational amplifier 15.

Therefore, the voltage dividing resistor R1 consists of Rtop, while the dividing resistor, R2, consists of error correction resistance elements, R1d0, R1d1, . , R1dm, set resistance elements RT0, RT1, . . . , RTm, and fuses, RL0, RL1, . . . , RLm, and Rbottom.

The divided voltage, which is to be fed back from the terminal Node M to the noninverting terminal of operational amplifier 15, is appropriately adjusted as follows.

First, another trimming code, T, is obtained from the relation $$T = \{(R_{top} + R_{bottom} + R_{1d0} + R_{1d1} + \ldots + R_{1dm})$$
$$\times (R_{bottom} + R_{1d0} + R_{1d1} + \ldots + R_{1dm}) \times (V_{mes} - V_{set})\}$$
$$/\{(R_{top} + R_{bottom} + R_{1d0} + R_{1d1} + \ldots + R_{1dm}) \times V_{set}$$
$$- (R_{bottom} + R_{1d0} + R_{1d1} + \ldots + R_{1dm}) \times V_{set}\} \quad (3).$$

Second, the trimming code T obtained from the relation (3) is subsequently converted to a binary number, and the unit resistors are identified among the series of unit resistors, SB0, SB1, ..., SBm, that correspond to the figures presently having "1" in the binary number.

Subsequently, by disconnecting the thus identified fuses, the selected value of the output voltage can be obtained for the voltage generating circuit.

Figure 6:
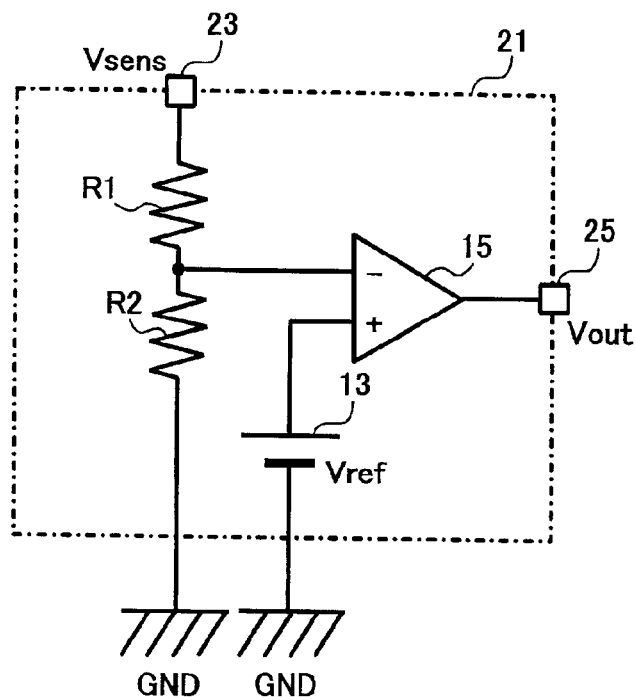
FIG. 6 is an electrical schematic diagram illustrating a voltage detection circuit.
Figure 7:
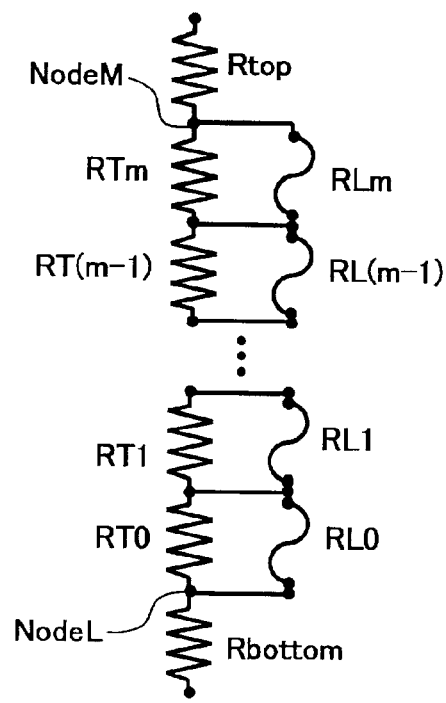
FIG. 7 is an electrical schematic diagram illustrating a resistance hybrid previously known.
Figure 8:
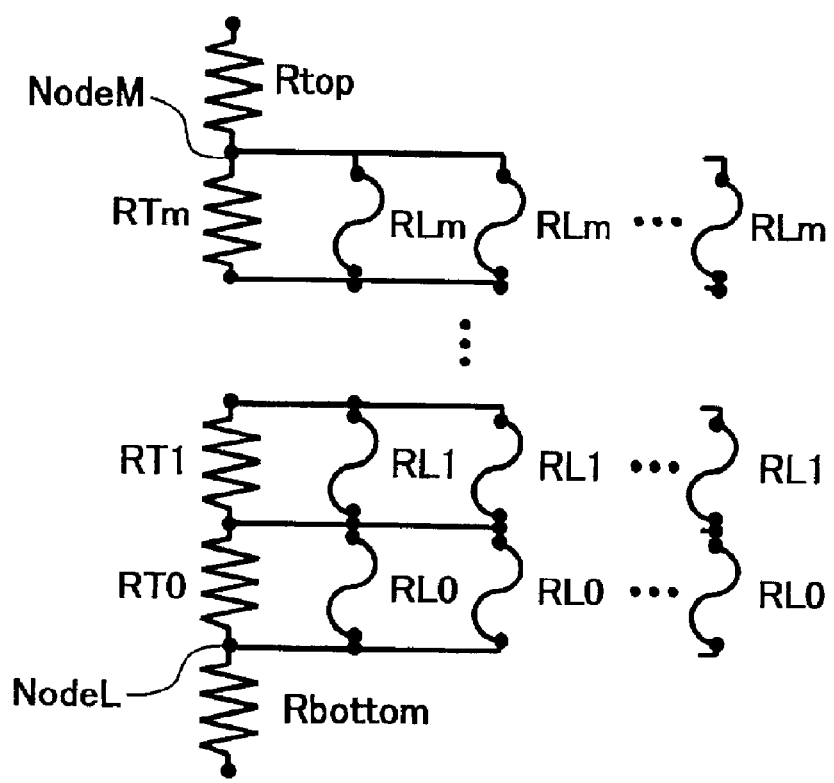
FIG. 8 is an electrical schematic diagram illustrating another resistance hybrid previously known.

According to another embodiment disclosed herein, the resistance hybrid of FIG. 1 is suitably incorporated into a voltage detection circuit illustrated in FIG. 6, in which the hybrid serves as a voltage divider consisting of dividing resistors, R1 and R2.

Referring to FIGS. 1 and 6, the voltage detection circuit 21 is formed at least by grounding the end terminal of the resistance hybrid on the Rbottom side, by connecting the end terminal thereof on the Rtop side to a terminal 23, and by connecting the junction terminal, Node L, to the noninverting terminal of operational amplifier 15.

The voltage dividing resistor R1 consists of Rtop, error correction resistance elements, R1d0, R1d1, ..., R1dm; set resistance elements, RT0, RT1, ..., RTm; and fuses, RL0, RL1, ..., RLm, while the dividing resistor R2 consists of Rbottom.

The divided voltage, which is to be input from the terminal Node L to noninverting terminal of operational amplifier 15, is appropriately adjusted as follows.

Another trimming code, T, is obtained from the relation $$T = (R_{top} + R_{bottom} + R_{1d0} + R_{1d1} + \ldots + R_{1dm})$$
$$\times (V_{set}/V_{mes} - 1)/R_{t0} \quad (4),$$

where $V_{set}$ is the set value of detecting voltage for the voltage detection circuit 21, and $V_{mes}$ is the input voltage to the terminal 23, which activates a switching of the output level of the operational amplifier 15, for example, from H to L measured prior to the fuse disconnection.

Subsequently, the trimming code, T, obtained from the relation (4) is converted to a binary number, and the unit resistors are identified among the series of unit resistors, SB0, SB1, ..., SBm, that correspond to the figures presently having "1" in the binary number. Then, by disconnecting the thus identified fuses, the selected value for the voltage detection can be attained for the voltage detection circuit.

Alternatively, the voltage detection circuit 21 of FIG. 6 may be formed at least by grounding the end terminal of the resistance hybrid on the Rbottom side, connecting the end terminal thereof on the Rtop side to a terminal 23, and connecting the junction terminal, Node M, to the noninverting terminal of operational amplifier 15.

Therefore, the voltage dividing resistor R1 consists of Rtop, while the dividing resistor, R2, consists of error correction resistance elements, R1d0, R1d1, ..., R1dm, set resistance elements, RT0, RT1, ..., RTm, and fuses, RL0, RL1, ..., RLm, and Rbottom.

The divided voltage, which is to be input from the terminal Node M to noninverting terminal of operational amplifier 15, is appropriately adjusted as follows.

Another trimming code, T, is obtained from the relation $$T = \{(R_{top} + R_{bottom} + R_{1d0} + R_{1d1} + \ldots + R_{1dm})$$
$$\times (R_{bottom} + R_{1d0} + R_{1d1} + \ldots + R_{1dm}) \times (V_{mes} - V_{set})\}$$
$$/\{(R_{top} + R_{bottom} + R_{1d0} + R_{1d1} + \ldots + R_{1dm}) \times V_{set}$$
$$- (R_{bottom} + R_{1d0} + R_{1d1} + \ldots + R_{1dm}) \times V_{set}\} \quad (5)$$

Subsequently, the trimming code T obtained from the relation (5) is converted to a binary number, and the unit resistors are identified among the series of unit resistors, SB0, SB1, ..., SBm, that correspond to the figures presently having "1" in the binary number. Then, by disconnecting the thus identified fuses, the selected value for the voltage detection can be attained for the voltage detection circuit.

Figure 4:
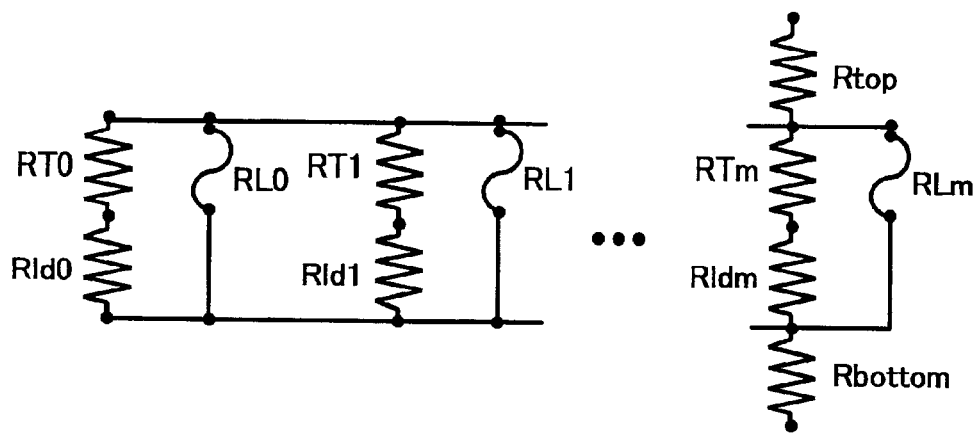
FIG. 4 is an electrical schematic diagram illustrating a resistance hybrid according to another embodiment disclosed herein, in which unit resistors are connected in parallel.

It should be noted that the construction of the present resistance hybrid and its application are not limited to the specific embodiments described herein above. For example, although the unit resistors, SB0, SB1, ..., SBm, are connected each other in series, these resistors may also be connected in parallel as illustrated in FIG. 4.

As another example, although the fuses are disconnected in general by irradiating laser beams, other means may alternatively be used such, for example, as electrical stress.

It is apparent from the above description including the examples, the resistance hybrids disclosed herein, and constant voltage generating and voltage detection circuits incorporating such resistance hybrids as the voltage divider are advantageous over previously known similar circuits.

For example, the resistance hybrid disclosed herein includes the set resistance element and error correction resistance element connected in series, to further be connected in parallel to the exclusive resistance element for disconnection, in which the resistance of the error correction resistance element is equal to the combined resistance of the set resistance element, the error correction resistance element, and the exclusive resistance element.

As a result, the resistance error caused by the disconnection can be reduced without appreciable increase in the resistance area.

In addition, by connecting the plurality of unit resistors, which are each consisting of a set resistance element, an error correction resistance element, and an exclusive resistance element for disconnection, are connected either in series, or in parallel, the resistance hybrid becomes capable of being properly adjustable its resistance value by disconnecting the exclusive resistance element. Therefore, the versatility of the resistance hybrid can be increased considerably.

Furthermore, the error correction resistance element and exclusive resistance element for disconnection, which is included in each of the plurality of unit resistors, are formed of polysilicon patterns, each of the patterns is formed of a same material, having an equal size and an equal alignment direction.

With the present materials selection and fabrication method for forming the error correction resistance elements and the exclusive resistance element, dispersion of the resistance value during process steps for these resistance elements can be reduced.

In another aspect, the resistance hybrid disclosed herein suitably serves as dividing resistors in the voltage detection circuit, including the set resistance element and error correction resistance element connected in series, to further be connected in parallel to the exclusive resistance element for disconnection, in which the resistance of the error correction resistance element is formed to be equal to the combined resistance of the set resistance element, the error correction resistance element, and the exclusively resistance element.

As a result, the resistance error, which is possibly caused by disconnection of the exclusive resistance element, can be alleviated, and the voltage error detected by the voltage detection circuit can be reduced.

In still another aspect, the resistance hybrid disclosed herein suitably serves also as dividing resistors in the constant voltage generation circuit, including the set resistance element and error correction resistance element connected in series, to further be connected in parallel to the exclusive resistance element for disconnection, in which the resistance of the error correction resistance element is formed in similar manner mentioned above to be equal to the combined resistance of the set resistance element, the error correction resistance element, and the exclusive resistance element for disconnection.

As a result, the resistance error, which is possibly caused by disconnection of the exclusive resistance element, can be alleviated, and the error in output voltage from the constant voltage generation circuit can be reduced.

The voltage generation and detection set forth in the present description may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus include also a computer-based product which may be hosted on a storage medium, and include instructions which can be used to program a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

Additional modifications and variations of the present invention are possible in light of the above teachings. It is therefore to be understood that within the scope of the appended claims, the invention may be practiced other than as specifically described herein.

What is claimed as new and desired to be secured by Letters Patent of the United States is:

1. A resistance hybrid comprising:
    a set resistance element;
    an error correction resistance element; and
    an exclusive resistance element for disconnection;
    wherein
        said set resistance element and said error correction resistance element being connected in series to form a series resistance element, said series resistance element and said exclusive resistance element for disconnection being connected in parallel; and
        a resistance of said error correction resistance element is equal to a combined resistance of said set resistance element, said error correction resistance element, and said exclusive resistance element for disconnection, prior to disconnecting said exclusive resistance element for disconnection.

2. The resistance hybrid according to claim 1, wherein a plurality of unit resistors, each consisting of said set resistance element, said error correction resistance element, and said exclusive resistance element for disconnection, are connected either in series or in parallel.

3. The resistance hybrid according to claim 2, wherein said error correction resistance element included in each of said plurality of unit resistors is formed of polysilicon patterns, each of said patterns being formed of a same material, equal in width and alignment direction.

4. The resistance hybrid according to claim 2, wherein said exclusive resistance element for disconnection included in each of said plurality of unit resistors is formed of polysilicon patterns, each of said patterns being formed of a same material, equal in size and alignment direction.

5. A voltage detection circuit comprising:
    dividing resistors for dividing an input voltage so as to supply a divided voltage;
    a reference voltage generator for supplying a reference voltage; and
    a comparator circuit for comparing said divided voltage with said reference voltage;
    wherein
        said dividing resistors include a plurality of unit resistors connected in series;
        said unit resistors each consist of a set resistance element, an error correction resistance element, and an exclusive resistance element for disconnection;
        said set resistance element and said error correction resistance element are connected in series to form a series resistance element;
        said series resistance element and said exclusive resistance element for disconnection are connected in parallel; and
        a resistance of said error correction resistance element is equal to a combined resistance of said set resistance element, said error correction resistance element, and said exclusive resistance element for disconnection, prior to disconnecting said exclusive resistance element for disconnection.

6. A constant voltage generation circuit comprising:
    an output driver for controlling an outputting an input voltage;
    dividing resistors for dividing said output so as to supply a divided voltage;
    a reference voltage generator for supplying a reference voltage; and
    a comparator circuit for comparing said divided voltage with said reference voltage so as to control an operation of said output driver based on comparison results;
    wherein
        said dividing resistors include a plurality of unit resistors connected in series;
        said unit resistors each consist of a set resistance element, an error correction resistance element, and an exclusive resistance element for disconnection;
        said set resistance element and said error correction resistance element are connected in series to form a series resistance element;
        said series resistance element and said exclusive resistance element for disconnection are connected in parallel; and
        a resistance of said error correction resistance element is equal to a combined resistance of said set resistance element, said error correction resistance element, and said exclusive resistance element for disconnection, prior to disconnecting said exclusive resistance element for disconnection.

7. A resistance hybrid comprising:
    a plurality of unit resistors connected either in series or in parallel;

said unit resistors each consisting of a set resistance element, an error correction resistance element, and an exclusive resistance element for disconnection; said set resistance element and said error correction resistance element being connected in series to form a series resistance element; and said series resistance element and said exclusive resistance element for disconnection being connected in parallel;

wherein a resistance of said error correction resistance element is equal to a combined resistance of said set resistance element, said error correction resistance element, and said exclusive resistance element for disconnection, prior to disconnecting said exclusive resistance element for disconnection.

8. The resistance hybrid according to claim 7, wherein said error correction resistance element included in each of said plurality of unit resistors is formed of polysilicon patterns, each of said patterns being formed of a same material, equal in width and alignment direction.

9. The resistance hybrid according to claim 7, wherein said exclusive resistance element for disconnection included in each of said plurality of unit resistors is formed of polysilicon patterns, each of said patterns being formed of a same material, equal in size and alignment direction.

10. A voltage detection circuit comprising:

dividing resistors for dividing an input voltage so as to supply a divided voltage, said dividing resistors further comprising,
   a plurality of unit resistors connected either in series or in parallel;
   said unit resistors each consisting of a set resistance element, an error correction resistance element, and an exclusive resistance element for disconnection; said set resistance element and said error correction resistance element being connected in series to form a series resistance element; and said series resistance element and said exclusive resistance element for disconnection being connected in parallel;
   wherein a resistance of said error correction resistance element is equal to a combined resistance of said set resistance element, said error correction resistance element, and said exclusive resistance element for disconnection, prior to disconnecting said exclusive resistance element for disconnection;
a reference voltage generator for supplying a reference voltage; and
a comparator circuit for comparing said divided voltage with said reference voltage.

11. A constant voltage generation circuit comprising:

an output driver for controlling an outputting an input voltage;
dividing resistors for dividing said output so as to supply a divided voltage, said dividing resistors further comprising,
   a plurality of unit resistors connected either in series or in parallel;
   said unit resistors each consisting of a set resistance element, an error correction resistance element, and an exclusive resistance element for disconnection; said set resistance element and said error correction resistance element being connected in series to form a series resistance element; and said series resistance element and said exclusive resistance element for disconnection being connected in parallel;
   wherein a resistance of said error correction resistance element is equal to a combined resistance of said set resistance element, said error correction resistance element, and said exclusive resistance element for disconnection, prior to disconnecting said exclusive resistance element for disconnection;
a reference voltage generator for supplying a reference voltage; and
a comparator circuit for comparing said divided voltage with said reference voltage so as to control an operation of said output driver based on comparison results.

12. A resistance hybrid comprising:

set resistance element means;
error correction resistance element means; and
exclusive resistance element means for disconnection;
said set resistance element means and said error correction resistance element means being connected in series to form series resistance element means, said series resistance element means and said exclusive resistance element means for disconnection being connected in parallel,
wherein a resistance of said error correction resistance element means is equal to a combined resistance of said set resistance element means, said error correction resistance element means, and said exclusive resistance element means for disconnection, prior to disconnecting said exclusive resistance element means for disconnection.

13. The resistance hybrid according to claim 12, wherein a plurality of unit resistor means, each consisting of said set resistance element means, said error correction resistance element means, and said exclusive resistance element means for disconnection, are connected either in series or in parallel.

14. The resistance hybrid according to claim 13, wherein said error correction resistance element means included in each of said plurality of unit resistor means is formed of polysilicon patterns, each of said patterns being formed of a same material, equal in width and alignment direction.

15. The resistance hybrid according to claim 13, wherein said exclusive resistance element means for disconnection included in each of said plurality of unit resistor means is formed of polysilicon patterns, each of said patterns being formed of a same material, equal in size and alignment direction.

16. A voltage detection circuit comprising:

dividing resistor means for dividing an input voltage so as to supply a divided voltage;
a reference voltage generator means for supplying a reference voltage; and
a comparator circuit means for comparing said divided voltage with said reference voltage;
wherein
   said dividing resistor means include a plurality of unit resistor means connected in series;
   said unit resistor means each consist of set resistance element means, error correction resistance element means, and exclusive resistance element means for disconnection;
   said set resistance element means and said error correction resistance element means are connected in series to form series resistance element means;
   said series resistance element means and said exclusive resistance element means for disconnection are connected in parallel; and a resistance of said error correction resistance element means is equal to a combined resistance of said set resistance element means, said error correction resistance element means, and said exclusive resistance element means for disconnection, prior to disconnecting said exclusive resistance element means for disconnection.

17. A constant voltage generation circuit comprising:

output driver means for controlling an outputting an input voltage;

dividing resistor means for dividing said output so as to supply a divided voltage;

reference voltage generator means for supplying a reference voltage; and comparator circuit means for comparing said divided voltage with said reference voltage so as to control an operation of said output driver means based on comparison results;

wherein
said dividing resistor means include a plurality of unit resistor means connected in series;
said unit resistor means each consist of set resistance element means, error correction resistance element means, and exclusive resistance element means for disconnection;
said set resistance element means and said error correction resistance element means are connected in series to form series resistance element means;
said series resistance element means and said exclusive resistance element means for disconnection are connected in parallel; and
a resistance of said error correction resistance element means is equal to a combined resistance of said set resistance element means, said error correction resistance element means, and said exclusive resistance element means for disconnection, prior to disconnecting said exclusive resistance element means for disconnection.

18. A resistance hybrid comprising:

a plurality of unit resistor means connected either in series or in parallel;

said unit resistor means each consisting of set resistance element means, error correction resistance element means, and exclusive resistance element means for disconnection;

said set resistance element means and said error correction resistance element means being connected in series to form series resistance element means; and said series resistance element means and said exclusive resistance element means for disconnection being connected in parallel;

wherein a resistance of said error correction resistance element means is equal to a combined resistance of said set resistance element means, said error correction resistance element means, and said exclusive resistance element means for disconnection, prior to disconnecting said exclusive resistance element means for disconnection.

19. The resistance hybrid according to claim 18, wherein said error correction resistance element means included in each of said plurality of unit resistor means is formed of polysilicon patterns, each of said patterns being formed of a same material, equal in width and alignment direction.

20. The resistance hybrid according to claim 18, wherein said exclusive resistance element means for disconnection, included in each of said plurality of unit resistor means, is formed of polysilicon patterns, each of said patterns being formed of a same material, having an equal size and an equal alignment direction.

21. A voltage detection circuit comprising:

dividing resistor means for dividing an input voltage so as to supply a divided voltage, said dividing resistor means further comprising,
a plurality of unit resistor means connected either in series or in parallel;
said unit resistor means each consisting of set resistance element means, error correction resistance element means, and exclusive resistance element means for disconnection;
said set resistance element means and said error correction resistance element means being connected in series to form series resistance element means; and
said series resistance element means and said exclusive resistance element means for disconnection being connected in parallel;
wherein a resistance of said error correction resistance element means is equal to a combined resistance of said set resistance element means, said error correction resistance element means, and said exclusive resistance element means for disconnection, prior to disconnecting said exclusive resistance element means for disconnection;

reference voltage generator means for supplying a reference voltage; and comparator circuit means for comparing said divided voltage with said reference voltage.

22. A constant voltage generation circuit comprising:

output driver means for controlling an outputting an input voltage;

dividing resistor means for dividing said output so as to supply a divided voltage, said dividing resistor means further comprising,
said set resistance element means and said error correction resistance element means being connected in series to form series resistance element means; and
said series resistance element means and said exclusive resistance element means for disconnection being connected in parallel;
wherein a resistance of said error correction resistance element means is equal to a combined resistance of said set resistance element means, said error correction resistance element means, and said exclusive resistance element means for disconnection, prior to disconnecting said exclusive resistance element means for disconnection;

reference voltage generator means for supplying a reference voltage; and comparator circuit means for comparing said divided voltage with said reference voltage so as to control an operation of said output driver means based on comparison results.

23. A semiconductor integrated circuit, comprising:

an analog circuit; and a voltage detection circuit, for producing a power condition signal indicating to said analog circuit whether an input voltage supplied to said analog circuit and said voltage detection circuit meets or exceeds a predetermined threshold voltage, said voltage detection circuit comprising:

a plurality of dividing resistors for dividing said input voltage so as to supply a divided voltage;

a reference voltage generator for supplying a reference voltage; and a comparator circuit for comparing said divided voltage with said reference voltage to generate said power condition signal wherein at least one of said plurality of dividing resistors comprise:

a set resistance element;

an error correction resistance element; and an exclusive resistance element for disconnection; wherein said set resistance element and said error correction resistance element being connected in series to form a series resistance element, said series resistance element and said exclusive resistance element for disconnection being connected in parallel; and a resistance of said error correction resistance element is equal to a combined resistance of said set resistance element, said error correction resistance element, and said exclusive resistance element for disconnection, prior to disconnecting said exclusive resistance element for disconnection.

24. The semiconductor integrated circuit of claim 23, wherein a plurality of unit resistors, each consisting of said set resistance element, said error correction resistance element, and said exclusive resistance element for disconnection, are connected either in series or in parallel.

25. The semiconductor integrated circuit of claim 24, wherein said error correction resistance element included in each of said plurality of unit resistors is formed of polysilicon patterns, each of said patterns being formed of a samed material, equal in width and alignment direction.

26. The semiconductor integrated circuit of claim 25, wherein said exclusive resistance element for disconnection included in each of said plurality of unit resistors is formed of polysilicon patterns, each of said patterns being formed of a same material, equal in size and alignment direction.

27. A semiconductor integrated circuit, comprising:

an analog circuit; and a voltage detection circuit, for producing a power condition signal indicating to said analog circuit whether an input voltage supplied to said analog circuit and said voltage detection circuit meets or exceeds a predetermined threshold voltage, said voltage detection circuit comprising:

dividing resistors for dividing said input voltage so as to supply a divided voltage;

a reference voltage generator for supplying a reference voltage; and a comparator circuit for comparing said divided voltage with said reference voltage; wherein said dividing resistors include a plurality of unit resistors connected in series;

said unit resistors each consist of a set resistance element, an error correction resistance element, and an exclusive resistance element for disconnection;

said set resistance element and said error correction resistance element are connected in series to form a series resistance element;

said series resistance element and said exclusive resistance element for disconnection are connected in parallel; and a resistance of said error correction resistance element is equal to a combined resistance of said set resistance element, said error correction resistance element, and said exclusive resistance element for disconnection, prior to disconnecting said exclusive resistance element for disconnection.

28. A semiconductor integrated circuit, comprising:

an analog circuit; and a constant voltage generation circuit, for receiving an input voltage, producing an output voltage at a constant level, and supplying said output voltage to said analog circuit, said constant voltage generation circuit comprising:

an output driver for controlling and outputting said output voltage;

dividing resistors for dividing said input voltage so as to supply a divided voltage;

a reference voltage generator for supplying a reference voltage; and a comparator circuit for comparing said divided voltage with said reference voltage so as to control an operation of said output driver based on comparison results; wherein said dividing resistors include a plurality of unit resistors connected in series;

said unit resistors each comprise:

a set resistance element;

an error correction resistance element; and an exclusive resistance element for disconnection; said set resistance element and said error correction resistance element are connected in series to form a series resistance element;

said series resistance element and said exclusive resistance element for disconnection are connected in parallel; and a resistance of said error correction resistance element is equal to a combined resistance of said set resistance element, said error correction resistance element, and said exclusive resistance element for disconnection, prior to disconnecting said exclusive resistance element for disconnection.

29. A semiconductor integrated circuit, comprising: an analog circuit; and a power circuit for regulating power to said analog circuit, said power circuit comprising a plurality of resistances, wherein at least one of said resistances is a resistance hybrid, said resistance hybrid comprising:

a plurality of unit resitors connectd either in series or in parallel; said unit resistors each consisting of a set resistance element, an error correction resistance element, and an exclusive resistance element for disconnection; said set resistance element and said error correction resistance element being connected in series to form a series resistance element; and said series resistance element and said exclusive resistance element for disconnection being connected in parallel;

wherein a resistance of said error correction resistance element is equal to a combined resistance of said set resistance element, said error correction resistance element, and said exclusive resistance element for disconnection, prior to disconnecting said exclusive resistance element for disconnection.

30. The semiconductor integrated circuit of claim 29, wherein said error correction resistance element include in each of said plurality of unit resistors is formed of polysilicon patterns, each of said patterns being formed of a samed material, equal in width and alignment direction.

31. The semiconductor integrated circuit of claim 29, wherein said exclusive resistance element for disconnection included in each of said plurality of unit resistors is formed of polysilicon patterns, each of said patterns being formded of a same material, equal in size and alignment direction.

32. A semiconductor integrated circuit, comprising: an analog circuit; and a voltage detection circuit, for producing a power condition signal indicating to said analog circuit whether an input voltage supplied to said analog circuit and said voltage detection circuit meets or exceeds a predetermined threshold voltage, said voltage detection circuit comprising:
- dividing resistors for dividng an input voltage so as to supply a divided voltage, said dividng resistors further comprising,
- a plurality of unit resistors connected either in series or in parallel;
- said unit resistors each consisting of
  a set resistance element,
  an error correction resistance element, and
  an exclusive resistance element for disconnection;
- said set resistance element and said error correction resistance element being connected in series to form a series resistance element; and
- said series resistance element and said exclusive resistance element for disconnection being connected in parallel;
- wherein a resistance of said error correction resitance element is equal to a combined resistance of said set resistance element, said error correction resistance element, and said exclusive resistance element for disconnection, prior to disconnecting said exclusive resitance element for disconnection;
- a reference voltage generator for supplying a reference voltage; and
- a comparator circuit for comparing said divided voltage with said reference voltage to produce said power condition signal.

33. A semiconductor integrated circuit, comprising: an analog circuit, and
- a constant voltage generation circuit, for reveiving an input voltage, producing an output voltage at a constant level, and supplying said output voltage to said analog circuit, said constant generation circuit comprising:
- an output dirver for controlling an outputting said output voltage;
- a dividing resistors for dividing said input voltage so as to supply a divided voltage, said dividing resistors further comprising a plurality of uint resistors connected either in series or in parallel;
- said unit resistors each consisting of a set resistance element, an erro correction resistance element, and an exclusive resistance element for disconnection;
- said set resistance element and said error correction resistance element being connected in series to form a series resistance element; and
- said series resistance element and said exclusive resistance element for disconnection being connected in parallel;
- a reference voltage generator for supplying a reference voltage; and
- a comparator circuit for comparing said divided voltage wit hsaid reference voltage so as to control an operation of said output dirver based on comparison results;
- wherein a resistance of said error correction resistance element is equal to a combined resistance of said set resistance element, said erro correction resistance element, and said exclusive resistance element for disconnection, prior to disconnecting said exclusive resistance element for disconnection.

* * * * *